US012651621B2

(12) United States Patent
Chan et al.

(10) Patent No.: US 12,651,621 B2
(45) Date of Patent: Jun. 9, 2026

(54) MEMORY DEVICE AND POWER-ON READING METHOD THEREOF

(71) Applicant: Winbond Electronics Corp., Taichung City (TW)

(72) Inventors: Johnny Chan, Fremont, CA (US); Chi-Shun Lin, Fremont, CA (US)

(73) Assignee: Winbond Electronics Corp., Taichung City (TW)

( * ) Notice: Subject to any disclaimer, the term of this patent is extended or adjusted under 35 U.S.C. 154(b) by 163 days.

(21) Appl. No.: 18/822,304

(22) Filed: Sep. 2, 2024

(65) Prior Publication Data

US 2026/0065961 A1     Mar. 5, 2026

(51) Int. Cl.
*G11C 16/30*     (2006.01)
*G11C 7/10*     (2006.01)
*G11C 7/20*     (2006.01)

(52) U.S. Cl.
CPC .............. *G11C 7/20* (2013.01); *G11C 7/1036* (2013.01); *G11C 7/1069* (2013.01)

(58) Field of Classification Search
CPC ........ G11C 7/20; G11C 7/1036; G11C 7/1069
See application file for complete search history.

(56) References Cited

U.S. PATENT DOCUMENTS

| | | | | |
|---|---|---|---|---|
| 7,433,247 B2 * | 10/2008 | Zheng | ................... | G11C 29/02 |
| | | | | 365/185.22 |
| 10,488,914 B2 | 11/2019 | Kojima | | |
| 11,705,213 B2 * | 7/2023 | Sudo | ...................... | G11C 17/16 |
| | | | | 365/185.22 |
| 2006/0077732 A1 * | 4/2006 | Hojo | ................... | G06F 11/1008 |
| | | | | 714/E11.034 |
| 2008/0253191 A1 * | 10/2008 | Kang | ..................... | G11C 16/20 |
| | | | | 365/185.18 |
| 2019/0214095 A1 * | 7/2019 | Sudo | ..................... | G11C 16/26 |

* cited by examiner

*Primary Examiner* — Min Huang
(74) *Attorney, Agent, or Firm* — JCIPRNET

(57) ABSTRACT

A power-on reading method of a memory device includes: generating a power-on signal according to a voltage level of a power voltage of the memory device; respectively detecting a plurality of ready states of a plurality of circuits in the memory device sequentially to generate a plurality of ready signals; reading a plurality of fuse states sequentially to generate a plurality of fuse state signals; and shifting a reference signal sequentially to generate a read pass indication signal according to the power-on signal, the plurality of ready signals and the plurality of fuse state signals by a plurality of registers coupled in series, wherein each of the plurality of registers is triggered when the power-on signal, corresponding ready signal or corresponding fuse state signal is at a setting logic value.

16 Claims, 6 Drawing Sheets

Vcc
POR
POS
BGR_r
DPMPb
RVPR_W
RD_ST1
RD_ST2
. . .
RD_STN
FUSRD

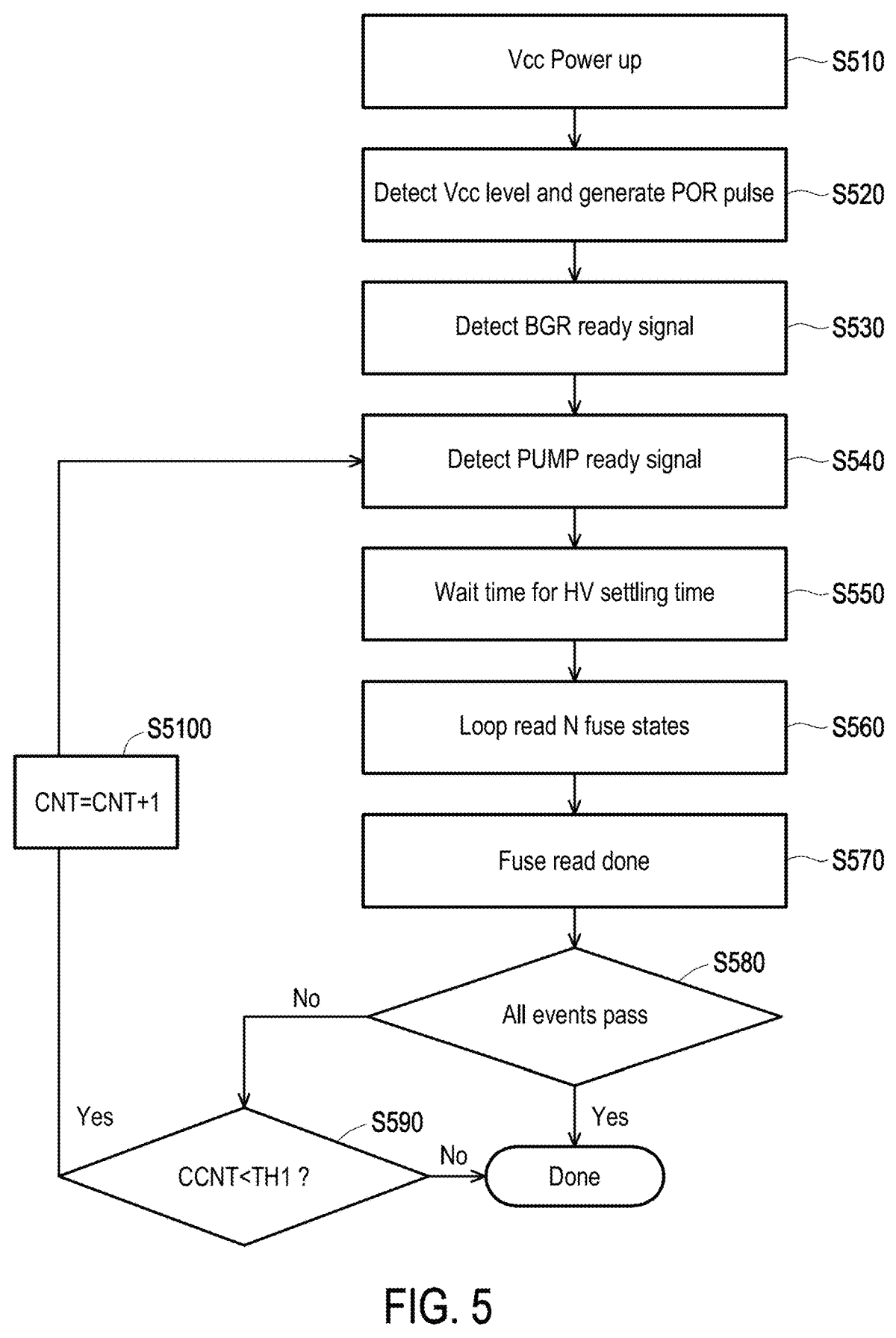

Vcc Power up ⎯ S510

Detect Vcc level and generate POR pulse ⎯ S520

Detect BGR ready signal ⎯ S530

Detect PUMP ready signal ⎯ S540

Wait time for HV settling time ⎯ S550

Loop read N fuse states ⎯ S560

Fuse read done ⎯ S570

S580
All events pass

No

Yes

S5100
CNT=CNT+1

S590
CCNT<TH1 ?

Yes

No

Done

FIG. 5

MEMORY DEVICE AND POWER-ON READING METHOD THEREOF

BACKGROUND

Technical Field

The disclosure relates to a memory device and a power-on reading method thereof, and in particular to the memory device and the power-on reading method thereof for logging power on read states by a plurality of stages of registers.

Description of Related Art

In a memory device, power-on fuse read operation may fail due to different power up slew rate, different power noise during a power voltage ramps up and other environment noise. It could be difficult to aware or find out if the power-on fuse read operation is failed and fuse data is wrong.

SUMMARY

The disclosure provides a memory device and a power-on reading method, which may can ensure to obtain chip status of the memory device.

The power-on reading method of a memory device includes: generating a power-on signal according to a voltage level of a power voltage of the memory device; respectively detecting a plurality of ready states of a plurality of circuits in the memory device sequentially to generate a plurality of ready signals; reading a plurality of fuse states sequentially to generate a plurality of fuse state signals; and shifting a reference signal sequentially to generate a read pass indication signal according to the power-on signal, the plurality of ready signals and the plurality of fuse state signals by a plurality of registers coupled in series, wherein each of the plurality of registers is triggered when the power-on signal, corresponding ready signal or corresponding fuse state signal is at a setting logic value.

The memory device includes a controller and a shift register circuit. The controller is configured to: generate a power-on signal according to a voltage level of a power voltage of the memory device; respectively detect a plurality of ready states of a plurality of circuits in the memory device sequentially to generate a plurality of ready signals; and read a plurality of fuse states sequentially to generate a plurality of fuse state signals. The shift register circuit is coupled to the controller. The shift register circuit is configured to shift a reference signal sequentially to generate a read pass indication signal according to the power-on signal, the plurality of ready signals and the plurality of fuse state signals by a plurality of registers coupled in series. Wherein each of a plurality of registers of the shift register circuit is triggered when the power-on signal, corresponding ready signal or corresponding fuse state signal is at a setting logic value.

Based on the above, the power-on read states of present disclosure can be stored in the shift register circuit in sequential, and the shift register circuit can shift the reference signal according to the power-on read states by triggering each of the registers when corresponding power-on read state is pass. Such as that, the read pass indication signal can be generated when all of the power-on read states are pass, and chip status of the memory device can be known accordingly.

BRIEF DESCRIPTION OF THE DRAWINGS

FIG. 5 illustrates a flow chart of a power-on reading method of a memory device according to another embodiment of present disclosure.

DESCRIPTION OF THE EMBODIMENTS

Figure 1:
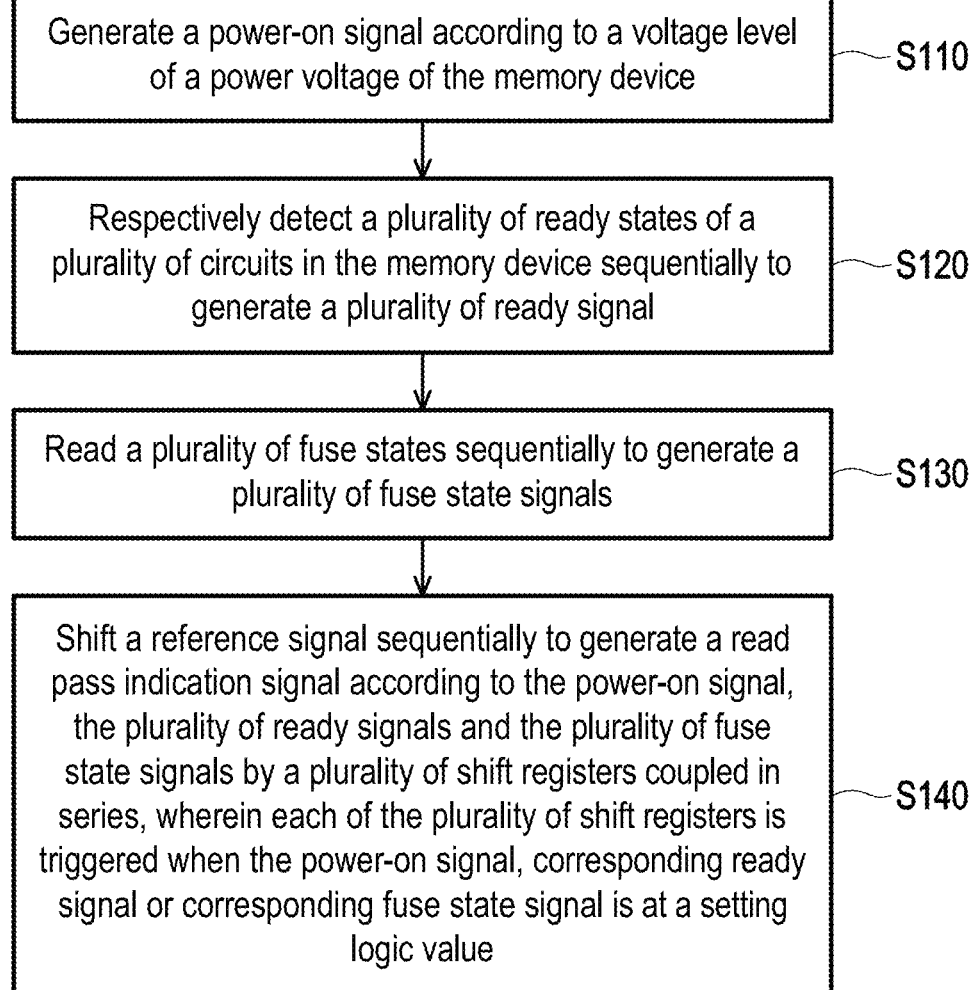
FIG. 1 illustrates a flow chart of a power-on reading method of a memory device according to an embodiment of present disclosure.

Please refer to FIG. 1, which illustrates a flow chart of a power-on reading method of a memory device according to an embodiment of present disclosure. In a step S110, the memory device may generate a power-on signal according to a voltage level of a power voltage. The power voltage is an operation voltage of the memory device. In a power-on sequence of the memory device, the memory device may provide a power-on detection circuit to detect a variation status of the voltage level of the power voltage. The power-on detection circuit may monitor the voltage level of the power voltage to generate a power-on signal, and generate a power-on reset (POR) signal when the voltage level of the power voltage is larger than a threshold value.

In a step S120, the memory device may respectively detect a plurality of ready states of a plurality of circuits in the memory device sequentially to generate a plurality of ready signals, and the memory device may read a plurality of fuse states sequentially to generate a plurality of fuse state signals in a step S130. In this embodiment, the circuits being detected in the step S120 include a band gap reference (BGR) voltage generator, a charge pump circuit, and a high power voltage generator. Wherein, the BGR voltage generator is configured to generate a BGR voltage, the charge pump circuit is configured to generate a pump-up voltage, and the high power voltage generator may be configured to generate a high power voltage. Corresponding to the BGR voltage generator, the memory device may detect whether a band gap reference voltage is ready or not to generate a band gap reference voltage ready signal. Corresponding to the charge pump circuit, the memory device may detect whether a pump-up voltage is ready or not to generate a charge pump ready signal. Corresponding to the high power voltage generator, the memory device may determine whether a waiting time is not less than a settle time of the high power voltage to generate a high power voltage settling time elapsed signal.

In the step S130, the memory device may read a plurality of fuse states sequentially in a loop, and a plurality of fuse state signals may be obtained.

It should be noted here, the steps S110 to S130 may be performed by a controller of the memory device. The controller may be a digital circuit or a processor having computational capability. Alternatively, the controller may be designed through hardware description languages (HDL) or any other design methods for digital circuits familiar to people skilled in the art and may be hardware circuits implemented through a field programmable gate array (FPGA), a complex programmable logic device (CPLD), or an application-specific integrated circuit (ASIC).

It should be noted here, in this embodiment, after the POR signal has been generated, the BGR voltage circuit, the charge pump circuit and the waiting time for the settle time of the high power voltage may be detected in sequential. Then, the memory device may perform read operations for reading the fuse states sequentially.

In a step S140, the memory device may provide a shift register circuit. The shift register circuit may receive a reference signal, and generate a read pass indication signal by shifting the reference signal sequentially according to the power-on signal, the plurality of ready signals and the plurality of fuse state signals with a plurality of registers coupled in series. In detail, each of the plurality of registers is triggered when the power-on signal, corresponding ready signal or corresponding fuse state signal is at a setting logic value.

On the other hand, in this embodiment, output signals of the registers may be stored into a storage medium. The shift register circuit may also outputs stored data to the controller of the memory device or an external host to report a plurality event states of the memory device.

Figure 2:
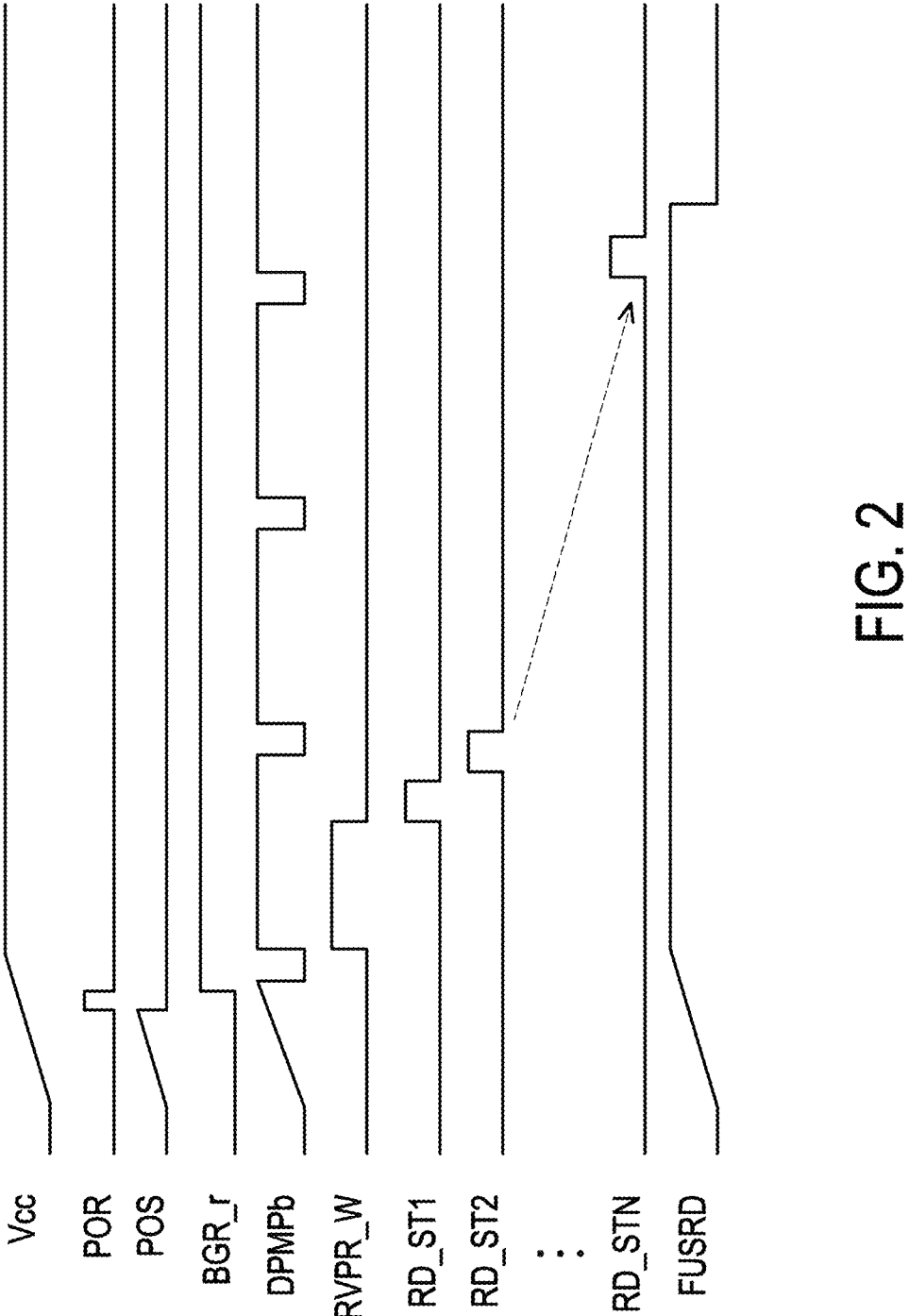
FIG. 2 illustrates a waveform plot of a power-on fuse read operation of a memory device according to an embodiment of present disclosure.

Please refer to FIG. 2, which illustrates a waveform plot of a power-on fuse read operation of a memory device according to an embodiment of present disclosure. In FIG. 2, a power voltage Vcc may gradually increase during a power-up sequence. The memory device may generate a power-up signal POS according to a variation of the power voltage Vcc by a power on detection circuit. Furthermore, the power on detection circuit may generate a power-on reset signal POR when the power voltage Vcc is not less than a threshold value. In the embodiment, the power-on reset signal POR has a positive pulse.

After the positive pulse of the power-on reset signal POR, the memory device may generate a band gap reference voltage ready signal BGR_r by detecting an operation of a band gap reference voltage generator. In detail, the memory device may identify whether the band gap reference voltage is read or not by detecting whether the band gap reference voltage reaches to a first target value stably. If the band gap reference voltage reaching to the first target value stably has been detected, the memory device may generate the band gap reference voltage ready signal BGR_r with logic value 1.

The memory device may also generate a charge pump ready signal DPMPb by detecting an operation of a charge pump circuit after the positive pulse of the power-on reset signal POR. The charge pump ready signal DPMPb may be a low-active signal. The memory device may set the charge pump ready signal DPMPb to logic value 0 when a pump-up voltage generated by the charge pump circuit reaches to a second target value. It should be noted here, the charge pump ready signal DPMPb may be pulled to logic value 0 for a plurality of times, and a plurality of negative pulses may be generated on the charge pump ready signal DPMPb.

After a first negative pulse of the charge pump ready signal DPMPb has been generated, the memory device starts to perform a waiting operation for waiting settling of a high power voltage, and generate a high power voltage settling time elapsed signal RVPR_W accordingly. In here, the high power voltage settling time elapsed signal RVPR_W has a positive pulse for indicating a settling waiting time for the high power voltage of the memory device.

After the positive pulse of the high power voltage settling time elapsed signal RVPR_W has been finished, the memory device may start to read a plurality of fuse states, and generate a plurality of fuse state signals RD_ST1 to RD_STN sequentially. Fuse state read operation can be started after a fuse read signal FUSRD rises to a stable high voltage level. After the latest fuse state signal RD_STN has been triggered, the fuse read signal FUSRD may be pulled to a low voltage level to indicate the fuse state read operation is complete.

Figure 3:
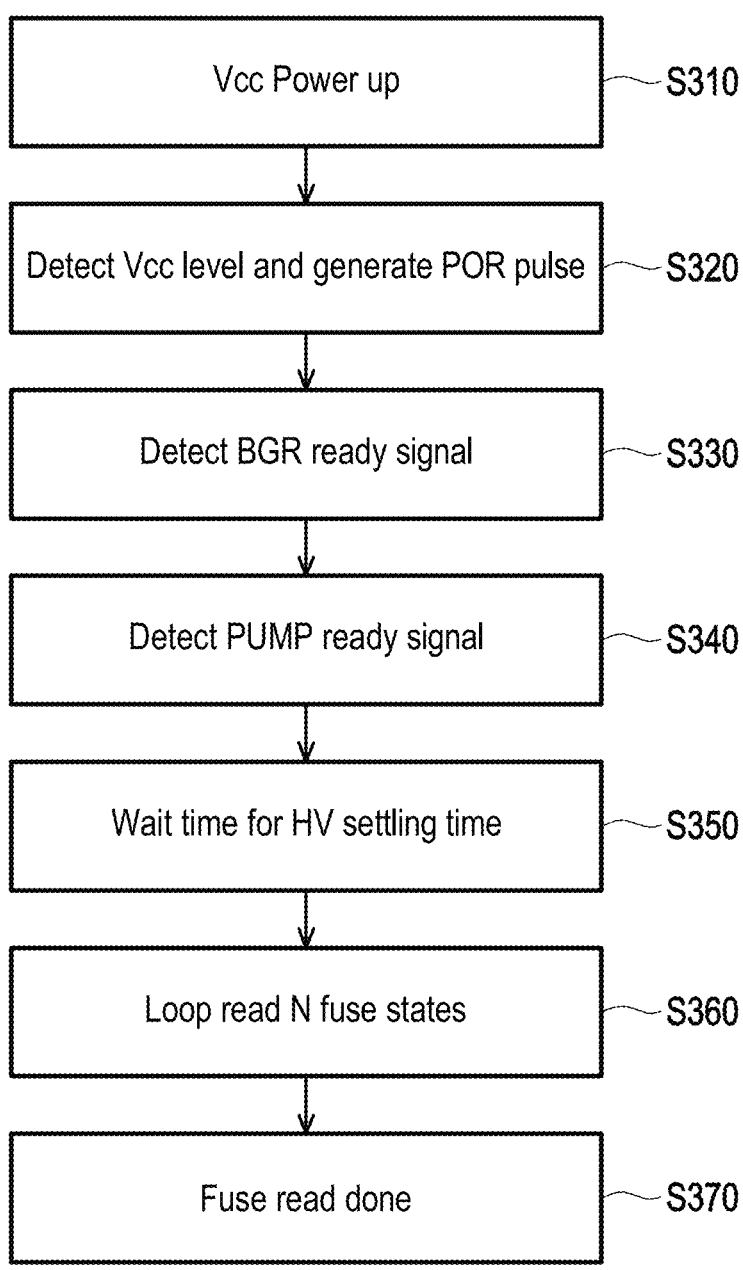
FIG. 3 illustrates a flow chart of a power-on reading method of a memory device according to another embodiment of present disclosure.

Please refer to FIG. 3, which illustrates a flow chart of a power-on reading method of a memory device according to another embodiment of present disclosure. In a step S310, a power voltage Vcc of the memory device is powered up. In a step S320, the memory device may detect a voltage level of the power voltage Vcc, and generate a power-on rest (POR) signal according to the voltage level of the power voltage Vcc. In a step S330, the memory device detects a band gap reference (BGR) ready signal according to a BGR voltage. In a step S340, the memory device detects a PUMP ready signal according to a pump-up voltage. In a step S350, the memory device waits for a certain time for a high power voltage (HV) settling time.

In a step S360, the memory device starts to loop read N fuse states, and in a step S370, the fuse read operation has been done.

It should be noted here, the steps S320 to S360 may be performed by a controller of a memory device.

Figure 4:
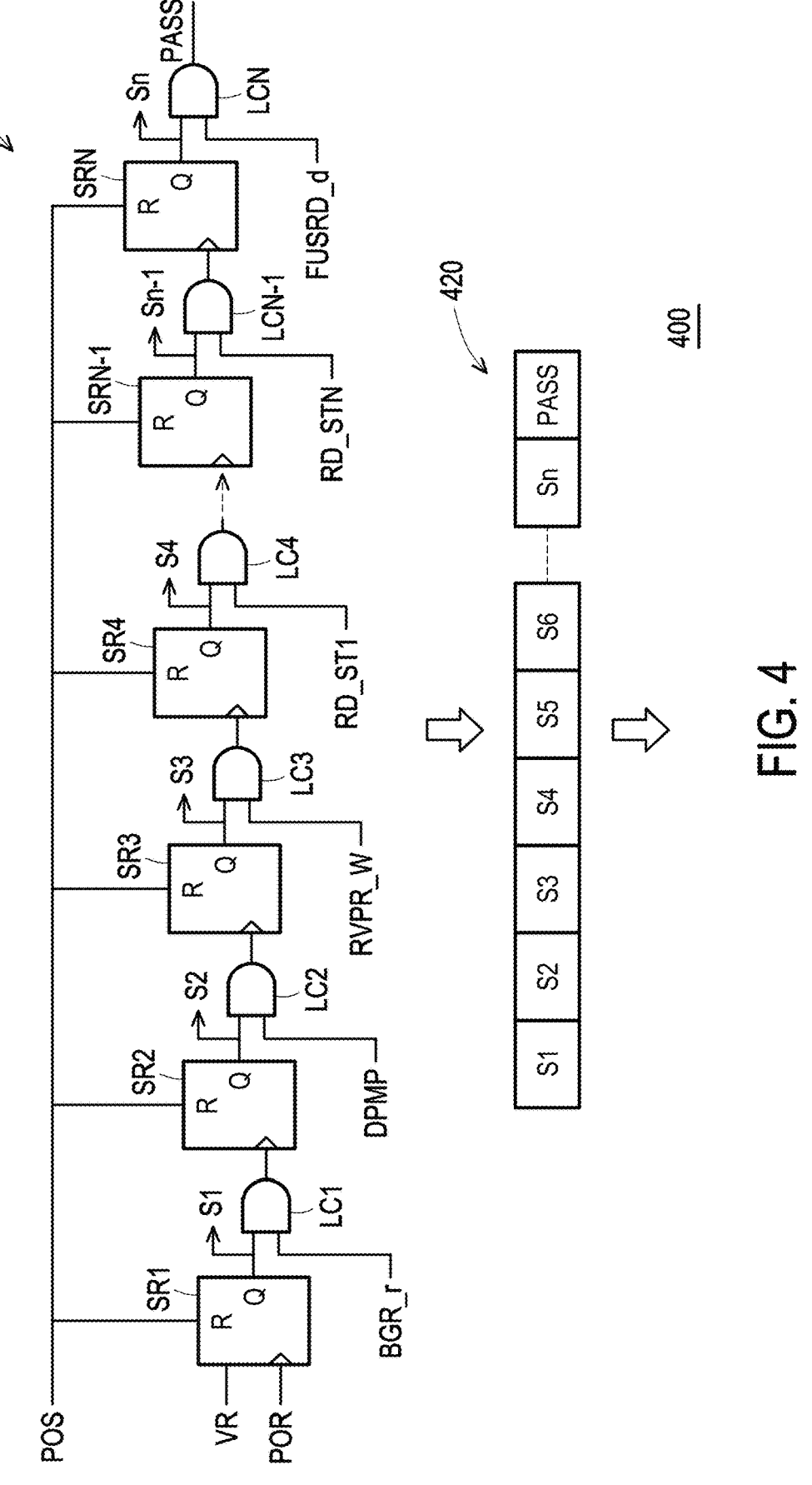
FIG. 4 illustrates a schematic diagram of a shift register circuit of a memory device according to an embodiment of present disclosure.

Please refer to FIG. 4, which illustrates a schematic diagram of a shift register circuit of a memory device according to an embodiment of present disclosure. The shift register circuit 400 includes a plurality of registers SR1 to SRN and logic circuit LC1 to LCN. The registers SR1 to SRN and the logic circuit LC1 to LCN are couple to each other alternatively. In detail, the registers SR1 to SRN are coupled in a series, and the logic circuits LC1 to LCN are respectively coupled to output ends Q of the registers SR1 to SRN. The registers SR1 to SRN respectively generate output signals S1 to Sn. In this embodiment, each of the registers SR1 to SRN is a D-type flip flop, and each of logic circuits LC1 to LCN may be an AND gate.

The first stage register SR1 receives a reference signal VR as a data signal, and receive a power-on reset signal POR as a trigger signal. The reference signal VR may be at logic value 1. When the power-on reset signal POR is triggered (rises to logic value 1), the register SR1 may generate an output signal S1 at logic value 1.

The logic circuits LC1 receives the output signal S1 and a band gap reference voltage ready signal BGR_r. An output end of the logic circuits LC1 is coupled to a clock end of the register SR2. The logic circuits LC1 performs a logic AND operation on the output signal S1 and the band gap reference voltage ready signal BGR_r to generate a trigger signal to the clock end of the register SR2. In detail operation, after the output signal S1 is toggled to logic value 1, when a memory controller detects the band gap reference voltage ready signal BGR_r is at a setting logic value (i.e. logic value 1), the register SR2 can be triggered, and generates an output signal S2 at output end Q.

The logic circuit LC2 receives the output signal S2 from the register SR2, and further receive a charge pump ready signal DPMP which is generated by detecting an operation of a charge pump circuit of the memory device. The charge pump ready signal DPMP is inverted to the charge pump ready signal DPMPb mentioned above, and the charge pump ready signal DPMP is a high-active signal. After the output signal S2 is toggled to logic value 1, when the memory controller detects the charge pump ready signal DPMPb is at logic value 1, the register SR3 can be triggered, and generates an output signal S3 at output end Q.

The logic circuit LC3 receives the output signal S3 from the register SR3, and further receive a high power voltage settling time elapsed signal RVPR_W which is generated by detecting a waiting time for settling state of a high power voltage. After the output signal S3 is toggled to logic value 1, when the memory controller detects the high power voltage settling time elapsed signal RVPR_W is at logic value 1, the register SR4 can be triggered, and generates an output signal S4 at output end Q.

The logic circuit LC4 to LCN-1 respectively receive output signal of the registers SR4 to SRN-1, and further respectively receive fuse state signals RD_ST1 to RD_STN. Each of the logic circuit LC4 to LCN-1 respectively generate trigger signals to clock end of corresponding register. The last stage register SRN generates the output signal Sn to the logic circuit LCN. The logic circuit LCN receives the output signal Sn and a signal FUSRD_d, where the signal FUSRD_d is used to indicate the fuse state read operation has been done. The logic circuit LCN generate a read pass indication signal PASS.

In present embodiment, when all of the band gap reference voltage ready signal BGR_r, the charge pump ready signal DPMP, the high power voltage settling time elapsed signal RVPR_W and the fuse state signals RD_ST1 to RD_STN are at logic value 1, the read pass indication signal PASS may be set to at logic value 1, too. When the read pass indication signal PASS is set to at logic value 1, it shows that the power-on fuse read operation has been passed. On the contrary, if the read pass indication signal PASS is set to at logic value 0, it shows that the power-on fuse read operation has been failed.

On the other hand, the shift register circuit 400 transmit the output signal S1 to Sn and the read pass indication signal PASS to a storage medium 420. The storage medium 420 is configured to store the output signals S1 to Sn and the read pass indication signal PASS. The storage medium 420 may be constructed by a plurality of registers in the memory device, or the storage medium 420 may be any type of memory circuit well known by a person skilled in this art, and no more limitation here.

The storage medium 420 is further configured to output stored data including the output signal S1 to Sn and the read pass indication signal PASS to a controller of the memory device or an external device. Such as that, the event states of the memory device can be reported. Since the output signals S1 to Sn are recorded independently, when the power on fuse read operation is fail, the output signals S1 to Sn which is failed can be obtained immediately, and fix operation can be performed on the event corresponding to the failed output signal.

Please refer to FIG. 5, which illustrates a flow chart of a power-on reading method of a memory device according to another embodiment of present disclosure. Steps S510 to S570 are similar to the steps S310 to S370 in the embodiment of FIG. 3, and no more repeated descriptions here. In this embodiment, in a step S580, the memory device may detect whether all events for power-on fuse state read operation are passed or not by checking whether all of the band gap reference voltage ready signal BGR_r, the charge pump ready signal DPMP, the high power voltage settling time elapsed signal RVPR_W and the fuse state signals RD_ST1 to RD_STN are at logic value 1 or not. If all of the band gap reference voltage ready signal BGR_r, the charge pump ready signal DPMP, the high power voltage settling time elapsed signal RVPR_W and the fuse state signals RD_ST1 to RD_STN are at logic value 1, the events are passed, and a flow of the power-on reading method has been done. On the contrary, if any one of the band gap reference voltage ready signal BGR_r, the charge pump ready signal DPMP, the high power voltage settling time elapsed signal RVPR_W and the fuse state signals RD_ST1 to RD_STN is not at logic value 1, the events are failed, and the flow of the power-on reading method may back to the step S540 again.

Before going back to the step S540, in a step S590, the memory device may compare the counting number CNT with a threshold number TH1, and if the counting number CNT is smaller than the threshold number TH1, a counting operation can be performed to accumulate a counting number CNT by 1 in a step S5100, and the flow of the power-on reading method can be back to the step S540. If the counting number CNT is not smaller than the threshold number TH1 in the step S590, the flow of the power-on reading method has been done.

In this embodiment, the threshold number TH1 may be set by a designer of the memory device according to actual application situation of the memory device, and no more special limitation here.

Figure 6:
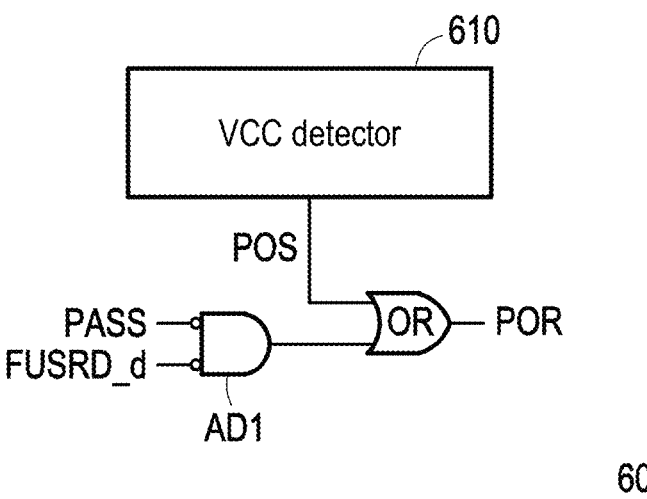
FIG. 6 illustrates a schematic diagram of a power-on detection circuit of a memory device according to an embodiment of present disclosure.

Please refer to FIG. 6, which illustrates a schematic diagram of a power-on detection circuit of a memory device according to an embodiment of present disclosure. The power-on detection circuit 600 includes a power voltage (VCC) detector 610 and logic gates AD1 and OR. The VCC detector 610 is configured to monitor a voltage variation state of a power voltage VCC, and generate a power-on signal POS. The logic gate AD1 is an AND gate which has two inverted input ends for respectively receiving a read pass indication signal PASS and a signal FUSRD_d used to indicate the fuse state read operation has been done. The logic gate OR receives the power-on signal POS and an output signal of the logic gate AD1, and the logic gate OR generates a power-on reset signal POR by performing OR operation on the power-on signal POS and an output signal of the logic gate AD1.

Figure 7:
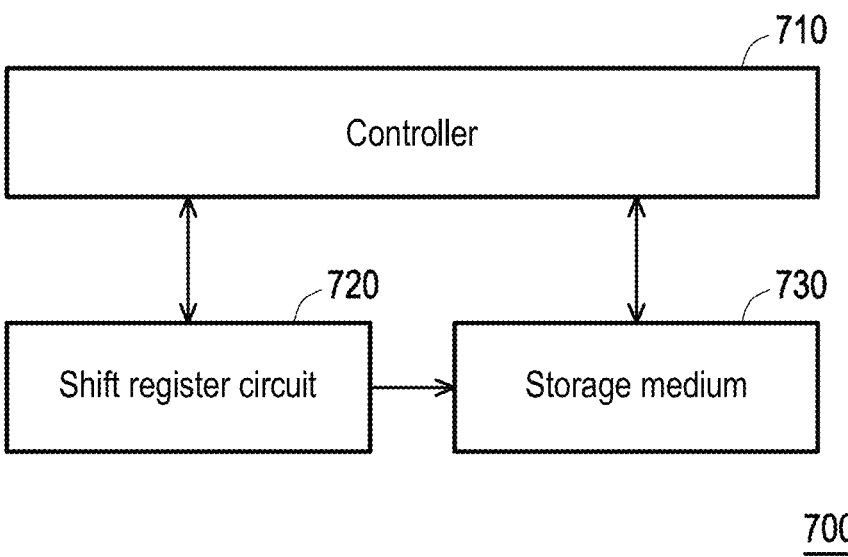
FIG. 7 illustrates a block diagram of a memory device according to an embodiment of present disclosure.

Please refer to FIG. 7, which illustrates a block diagram of a memory device according to an embodiment of present disclosure. The memory device 700 includes a controller 710, a shift register circuit 720 and a storage medium 730. The controller 710 may be coupled to the shift register circuit 720 and the storage medium 730, and the shift register circuit 720 is coupled to the storage medium 730. Detail operations of the controller 710, the shift register circuit 720 and the storage medium 730 have been described in the embodiments mentioned above, and no more repeated descriptions here.

It should be noted here, the memory device 700 also includes memory cell array and corresponding peripheral circuits which are not illustrated in FIG. 7. It is not means that the memory cell array and corresponding peripheral circuits need not appear in the memory device 700. In fact, FIG. 7 only illustrates circuit components for performing power-on fuse state read operation, not all circuit components of the memory device 700.

What is claimed is:
1. A power-on reading method of a memory device, comprising:
   generating a power-on signal according to a voltage level of a power voltage of the memory device;

respectively detecting a plurality of ready states of a plurality of circuits in the memory device sequentially to generate a plurality of ready signals;

reading a plurality of fuse states sequentially to generate a plurality of fuse state signals; and shifting a reference signal sequentially to generate a read pass indication signal according to the power-on signal, the plurality of ready signals and the plurality of fuse state signals by a plurality of shift registers coupled in series, wherein each of the plurality of shift registers is triggered when the power-on signal, corresponding ready signal or corresponding fuse state signal is at a setting logic value.

2. The power-on reading method according to claim 1, further comprising:

storing output signals of the plurality of shift registers and the read pass indication signal to a storage component.

3. The power-on reading method according to claim 2, further comprising:

outputting stored data for reporting a plurality event states by the storage component.

4. The power-on reading method according to claim 1, wherein the plurality of ready states of the plurality of circuits comprises a band gap reference voltage ready signal, a charge pump ready signal and a high power voltage settling time elapsed signal.

5. The power-on reading method according to claim 4, wherein a step of respectively detecting the plurality of ready states of the plurality of circuits in the memory device sequentially comprises:

detecting the band gap reference voltage ready signal, the charge pump ready signal and the high power voltage settling time elapsed signal in sequential.

6. The power-on reading method according to claim 1, further comprising:

corresponding to each of the shift registers, performing a logic operation on an output signal of previous stage shift register with corresponding ready signal or corresponding fuse state signal to generate a trigger signal; and providing the trigger signal to a clock end of current stage shift register.

7. The power-on reading method according to claim 6, wherein the logic operation is an AND operation.

8. A memory device, comprising:

a controller, being configured to:

generate a power-on signal according to a voltage level of a power voltage of the memory device;

respectively detect a plurality of ready states of a plurality of circuits in the memory device sequentially to generate a plurality of ready signals; and read a plurality of fuse states sequentially to generate a plurality of fuse state signals; and a shift register circuit, coupled to the controller, the shift register circuit being configured to shift a reference signal sequentially to generate a read pass indication signal according to the power-on signal, the plurality of ready signals and the plurality of fuse state signals by a plurality of shift registers coupled in series, wherein each of a plurality of shift registers of the shift register circuit is triggered when the power-on signal, corresponding ready signal or corresponding fuse state signal is at a setting logic value.

9. The memory device according to claim 8, wherein the shift register circuit comprises:

the plurality of shift registers, coupled in series; and a plurality of logic circuits, wherein each of the plurality of logic circuits is coupled to an output end of each of the plurality of shift registers.

10. The memory device according to claim 8, wherein a first stage shift register receives the power-on signal as a trigger signal, and the other stage shift resisters respectively receive the output signals of the plurality of logic circuits as trigger signals.

11. The memory device according to claim 8, further comprising:

a storage component, coupled to the shift register circuit, the storage component in configured to store output signals of the shift registers and the read pass indication signal.

12. The memory device according to claim 11, wherein the storage component further outputs stored data for reporting a plurality of event states of the memory device.

13. The memory device according to claim 8, wherein the plurality of ready states of the plurality of circuits comprises a band gap reference voltage ready signal, a charge pump ready signal and a high power voltage settling time elapsed signal.

14. The memory device according to claim 8, wherein the controller detects the band gap reference voltage ready signal, the charge pump ready signal and the high power voltage settling time elapsed signal in sequential.

15. The memory device according to claim 8, wherein each of the plurality of logic circuits performs a logic operation on an output signal of previous stage shift register with corresponding ready signal or corresponding fuse state signal to generate a trigger signal.

16. The memory device according to claim 8, wherein each of the plurality of logic circuits is an AND gate.

* * * * *